United States Patent [19]

Kneip, Jr.

[11] Patent Number: Re. 31,895

[45] Reissued Date of Patent: May 21, 1985

[54] NMR SPECTROMETER WITH SUPERCONDUCTING COIL HAVING RECTANGULAR CROSS-SECTION WIRE

[75] Inventor: George D. Kneip, Jr., Menlo Park, Calif.

[73] Assignee: Varian Associates, Inc., Palo Alto, Calif.

[21] Appl. No.: 485,983

[22] Filed: Sep. 12, 1983

Related U.S. Patent Documents

Reissue of:

[64] Patent No.: 4,213,092
Issued: Jul. 15, 1980
Appl. No.: 879,291
Filed: Feb. 21, 1978

[51] Int. Cl.[3] ..... G01R 33/08

[52] U.S. Cl. ..... 324/319; 324/318; 324/322

[58] Field of Search ..... 324/318-322; 335/216

[56] References Cited

U.S. PATENT DOCUMENTS

| | | | |
|---|---|---|---|
| 3,287,630 | 11/1966 | Gang | 324/319 |
| 3,419,904 | 12/1968 | Weaver et al. | 324/319 |
| 3,564,398 | 2/1971 | Nelson | 324/319 |
| 3,569,823 | 3/1971 | Golay | 324/319 |
| 3,577,067 | 5/1971 | Weaver, Jr. | 324/0.5 H |

*Primary Examiner*—Michael J. Tokar
*Attorney, Agent, or Firm*—Stanley Z. Cole; Edward H. Berkowitz

[57] ABSTRACT

An NMR spectrometer includes a superconducting, solenoid coil formed of superconducting wire having a rectangular cross-section. The wire is formed of a non superconducting metal surrounding superconducting material having a small enough cross sectional area that a magnetic field resulting from current flowing in the superconductor material has a relatively constant position relative to the cross section of the wire. In one embodiment, the wire has a monofilament configuration including a core of the superconducting material surrounded by a sheath of the metal. In a second embodiment, the wire includes a copper block of the metal through which a multiplicity of superconductive strands extend.

15 Claims, 5 Drawing Figures

FIG.2
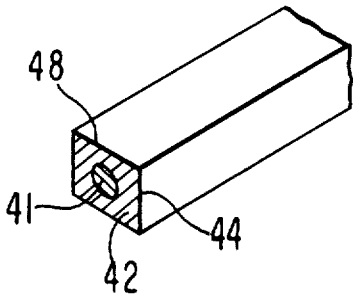
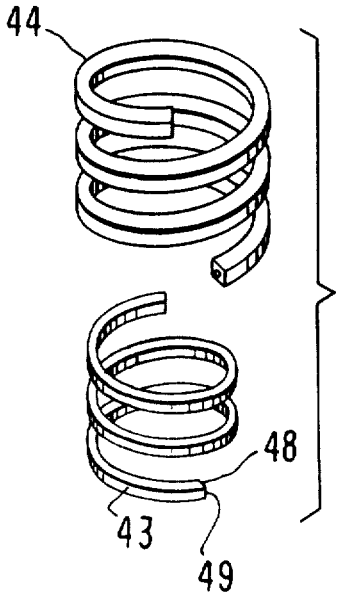
FIG.3
FIG.5
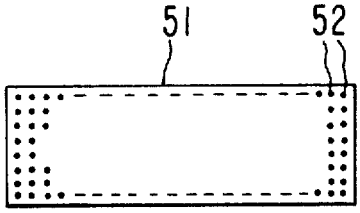
FIG.4
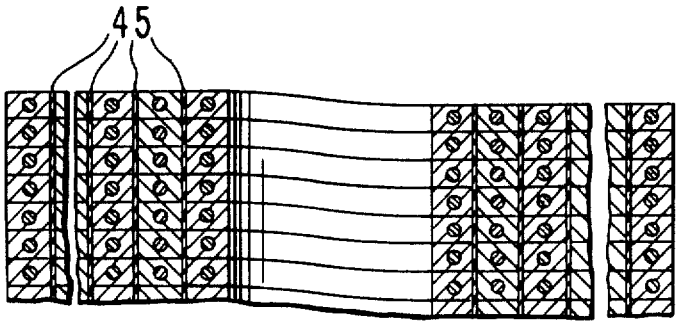

NMR SPECTROMETER WITH SUPERCONDUCTING COIL HAVING RECTANGULAR CROSS-SECTION WIRE

Matter enclosed in heavy brackets [ ] appears in the original patent but forms no part of this reissue specification; matter printed in italics indicates the additions made by reissue.

FIELD OF THE INVENTION

The present invention relates generally to nuclear magnetic resonance (NMR) spectrometers, and more particularly, to an NMR spectrometer having a superconducting solenoid formed of a superconducting wire with a rectangular cross-section.

BACKGROUND OF THE INVENTION

Some superconducting solenoids previously used in connection with NMR spectrometers have employed superconducting wire having a circular cross-section. In one configuration, the wire has been of monofilament form including a core formed of a superconducting material, such as Niobium-titanium alloy, surrounded by a sheet of non-superconducting metal having a relatively low room temperature conductivity, such as copper. Typically, the diameter of the circular cross-section wire has been between 0.016" to 0.030". The superconducting, monofilament wire is typically wound as a helix having multiple, concentric layers, between each of which is located a thin dielectric sheet, such as Mylar. Adjacent layers usually have to be wound in opposite longitudinal directions, i.e., have oppositely directed pitches.

After the first layer of the solenoid has been wound, the subsequent layers are not true helices because the round wire tends to fall into the grooves between windings of the previously wound layer. Because adjacent layers are wound in opposite directions, each turn of a subsequently wound layer follows the pitch of the previously wound layer and then jumps over a turn of the immediately previously wound layer. Hence, there is a non-uniformity in the pitch of the winding between successive turns of every helical layer, except the first layer. This winding non-uniformity causes substantial radial and spiral gradients in the magnetic field which is produced when the superconducting solenoid is energized with a current, whereby the magnetic field is not homogeneous in the interior of the solenoid, where a tested sample, as well as the rf excitation and pick-up coils, are located. The spiral field gradient occurs because of the tendency of the round wire to follow the groove between adjacent wires of the previously wound layer. The jump over between adjacent turns of the same layer causes a radial field gradient to be produced. Previous attempts to correct these field gradients have been very difficult and expensive, and, where adopted have not proven successful.

BRIEF DESCRIPTION OF THE INVENTION

In accordance with the present invention, a superconducting solenoid for use in NMR spectroscopy has improved field homogeneity, without a substantial spiral gradient and with materially reduced radial gradients, by employing superconducting wire having a rectangular cross-section.

The wire is formed of a non-superconducting metal having a relatively high room temperature conductivity, e.g., copper. The non-superconducting metal surrounds superconducting material having a relatively small cross sectional area so that a magnetic field resulting from current flowing in the superconductor has a relatively constant position relative to the cross section of the wire.

By employing superconducting wire having a rectangular cross-section, the problems of the prior art are avoided because each layer is formed as a true, constant diameter cylinder without grooves into which wire of the next layer can extend. Hence, each layer is formed as a true helix so that the helices associated with each layer are concentric with a longitudinal axis of the coil. Immediately adjacent layers have helices with oppositely directed pitches and faces that abut substantially against each other. The abutting faces of adjacent helices are spaced from each other only by a relatively thin layer of dielectric material, such as Mylar, which reduces the adjacent layer to layer electrical shorting of the solenoid so it can be charged in a reasonable time. Adjacent turns of the same helix have faces that abut against each other. The faces may be covered by a dielectric coating, but this may not be essential.

In a preferred embodiment, adjacent faces of the wire differ in length so that the longer and shorter faces respectively extend parallel and transversly to the longitudinal axis of the solenoid coil. This configuration has been found to be very advantageous because it facilitates winding of the individual helices by avoiding the tendency for adjacent turns of the same helix to sag to the side of the previously wound turn. It is to be understood, however, that the term rectangular is not limited to wire in which adjacent faces necessarily differ in length, but that the term rectangular is to be considered broad enough to encompass wire having a square cross-section. However, square cross-section wire is not generally considered to be advantageous because it is difficult to prevent such wire from twisting during winding.

In one embodiment, the superconducting wire has a monofilament configuration with a core of the superconducting material surrounded by a sheath of the non-superconducting metal. Tests performed on wire having this configuration, with exterior dimensions of 0.016"×0.013" and a circular cross section core with a diameter of 0.010", indicate that the transverse magnetic field gradient is considerably reduced and that there are virtually no spiral gradients because of the true alternation of the pitch of each layer relative to the immediately preceding layer.

In accordance with a second embodiment of the invention, the wire includes an exterior block of the non-superconducting metal. Extending through the block are a multiplicity of superconductor strands. In one embodiment, such a block has dimensions of 1 millimeter×0.36 millimeter and 3,553 strands, each having a cross-sectional dimension of approximately 5 microns, extends through the block.

While NMR superconducting solenoids employing rectangular cross section wire that is formed as oppositely directed helices have been previously developed (see Kingston et al., U.S. Pat. No. 3,559,128), these prior art solenoids have not had homogeneous magnetic field properties. The wire in this prior art structure is formed as a ribbon of superconductor bonded to a non-superconducting metal strip formed of a material that has high room temperature conductivity. The strip and ribbon are approximately ⅛" in width. Only certain strands across the relatively wide superconductor ribbon can carry the superconducting current. The current carrying strands have a tendency to be localized at the edges of the ribbon so there is a tendency for the current to flow in an unpredictable manner through differing edges of the ribbon. Hence, the magnetic field has a non-uniform, unpredictable distribution across the cross section of the wire, which leads to a non-homogeneous magnetic field. This is in contrast to the present invention wherein the superconductor cross section is so small that the superconducting current has a constant positon relative to the cross section.

It is also realized that superconducting solenoids have been previously fabricated from multi-filament, braided wire having an external rectangular cross-section for high power applications. The superconducting wire has a relatively large cross-sectional area, with each side of the wire being between 1/16" and 1". This large cross-sectional area wire does not produce a homogeneous magnetic field if wound as a helical solenoid for reasons similar to those discussed in connection with the ribbon.

For high power applications, the large cross-sectional area wire has been employed to enable the inductance of the superconducting coil to be kept at a relatively low value. If highly inductive, low cross-sectional area wire (as employed with the present invention) is used with high power superconductive coils, modest changes in circulating current may lead to collapse of the magnetic field. Such a field collapse results in thermal shock to the entire system. This problem generally does not exist in NMR superconducting wires, which preferably have small cross sectional areas to reduce winding errors, and to limit wire costs and amperage. Superconducting solenoids utilized with NMR spectrometers have relatively low circulating currents of 30 to 50 amperes, compared to current flows of at least several hundred amperes in power applications. In the high power superconducting magnets, the problems associated with field homogeneity also do not usually arise and corrections for a spiral gradient are not necessary. Hence, the reasons for employing rectangular cross-sectional wire in superconducting coils used for power applications differ markedly from the reasons why rectangular cross-section wires are employed in the present invention, in connection with NMR spectrometers.

It is, accordingly, an object of the present invention to provide an NMR spectrometer with an improved superconducting solenoid.

Another object of the invention is to provide an NMR spectrometer with a superconducting solenoid that produces a magnetic field of great homogeneity.

Another object of the invention is to provide an NMR spectrometer superconducting solenoid that has relatively low transverse magnetic field gradients.

Another object of the present invention is to provide an NMR superconducting solenoid having substantially no spiral magnetic field gradients.

Yet another object of the invention is to provide an NMR spectrometer with a superconducting solenoid wherein adjacent layers are wound as true helices.

The above and further objects and features of the invention will become apparent from the following description of the drawings.

BRIEF DESCRIPTION OF THE DRAWING

FIG. 2 is a perspective view of one embodiment of a superconducting wire in accordance with the invention;

FIG. 3 is an exploded view of a pair of adjacent layers of a superconducting coil in accordance with the invention;

FIG. 4 is a cross-sectional view of a portion of a superconducting coil in accordance with the invention; and FIG. 5 is a cross-sectional view of a second embodiment of a superconducting wire that can be utilized with the NMR spectrometer.

DETAILED DESCRIPTION OF THE DRAWING

Figure 1:
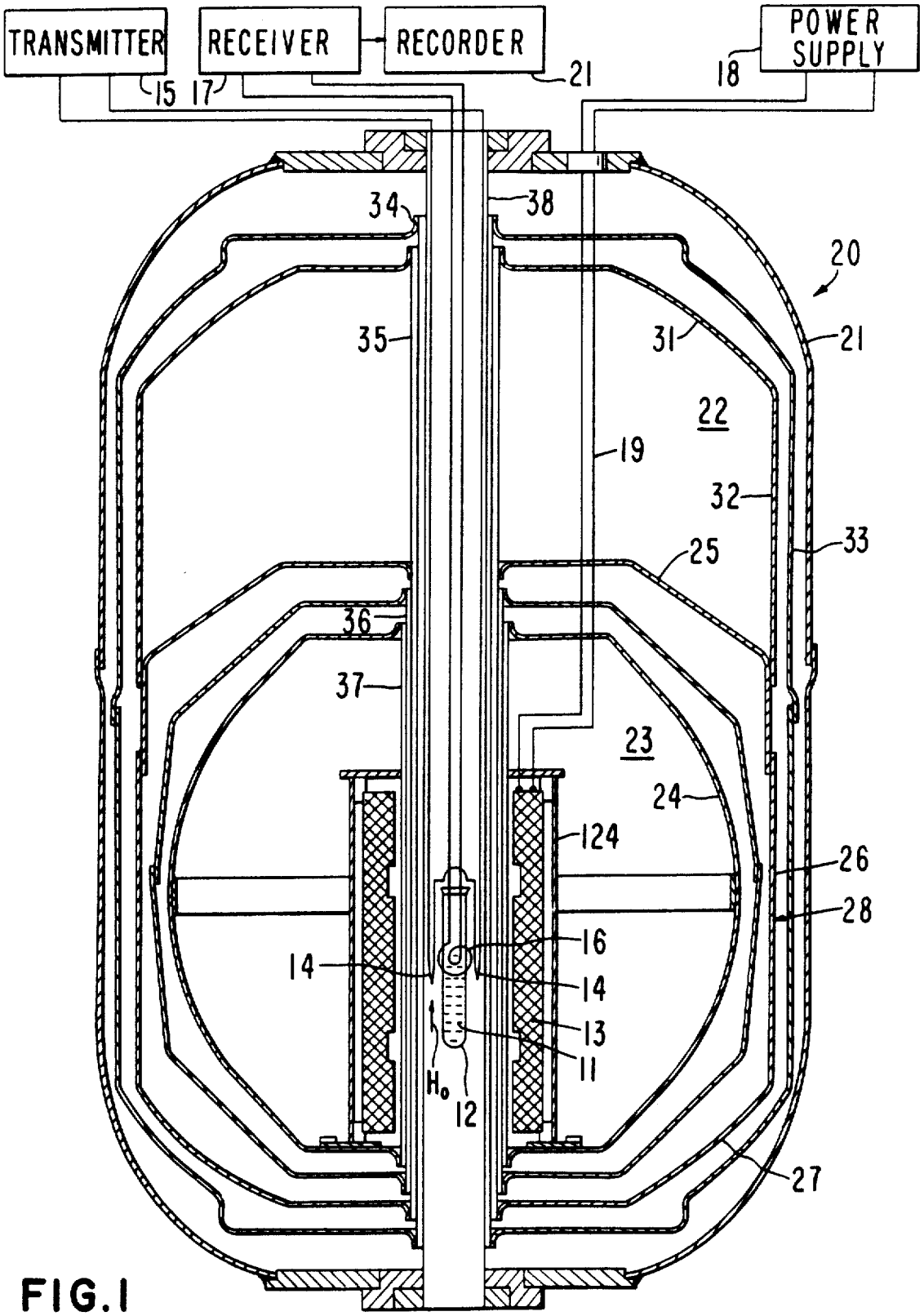
FIG. 1 is a cross-sectional view of an NMR spectrometer including a superconducting coil of the present invention, in combination with apparatus for enabling the spectrometer to be used.

Reference is now made of FIG. 1 of the drawing wherein there is illustrated a representative nuclear magnetic resonance spectrometer utilizing a superconducting magnet system. Sample 11 to be investigated for NMR characteristics is disposed within vial 12 that is located within a homogenous magnetic field $H_o$ produced by superconducting solenoid 13 in its interior or central core. A pair of transmiter coils 14 straddle vial 12 in the core of solenoid 13 so that the axes of coils 14 are substantially aligned with each other and are at right angles to the field $H_o$. Transmitter coils 14 respond to rf energy derived by rf transmitter 15 to apply rf energy to sample 11. At right angles to the directions of the axes of coils 14 and field $H_o$ is the axis of receiver coil 16, positioned in the core of solenoid 11, proximite to vial 12 so coil 16 derives a signal indicative of the NMR properties of sample 11. Receiver coil 16 supplies an input signal to radio receiver 17.

Superconducting solenoid 13 is energized by DC power supply 18 via leads 19 that are schematically shown as extending through Dewar 20 and which are connected to energize solenoid 13. In response to energization current from power supply 18, coil 13 generates the relatively high intensity, homogeneous DC magnetic field $H_o$ that extends throughout the volume of sample 11. Typically, an energization current of 40–50 amperes flows in superconductor solenoid 13 to produce a dc magnetic field $H_o$ on the order of 47 to 70 kilogauss. As is conventional in modern NMR spectrometers employing superconducting solenoids, once solenoid 13 has been energized by power supply 18, it is disconnected from the power supply, except under unusual circumstances. To achieve sweeping of the properties of sample 11, transmitter 15 supplies pulses of rf energy to coil 14, and these pulses are selectively absorbed by the sample. Pickup coil 16 transduces the energy that is re-radiated from sample 11 and supplies a signal spectrum to receiver 17. Receiver 17 includes Fourier transform calculating apparatus that enables a trace of the NMR characteristics of sample 11 to be derived and displayed by X - Y recorder 21.

Coil 13 is maintained at cryogenic, liquid helium temperatures on the order of 4.2 degrees K. In a preferred embodiment, this cryogenic temperature of solenoid coil 13 is established in a Dewar 20 having an exterior, aluminum shell 21 in which is located an aluminum can 22 that holds liquid nitrogen at approximately 77° K. Below liquid nitrogen can 22 is a further can 23 that is filled with liquid helium. Can 23 surrounds cylinder/24 in which superconducting coil 13 is located. An evacuated space, typically at a vacuum of less than $10^{-5}$ torr, exists between wall 24 of can 23 and floor 25 of can 22, as well as between wall 24 and side wall 26 and floor 27 of aluminum thermal shield 28. In the evacuated space immediately outside of can 23 is a further aluminum, thermal shield 29. A further evacuated space exists between roof 31 and side wall 32 of can 22, as well as between wall 26 and floor 27 of shield 28, and the interior of shell 20. In this further evacuated space is located another thermal shield 33. To assist in minimizing the flow of heat from the exterior of Dewar 20 to superconducting coil 13, shield 33, roof 31, floor 25, and shield 29 are respectively provided with sleeves 34, 35 and 36, all of which are concentric with bore 37 that extends through the interior of can 23. Bore 37 is coaxial with sleeve 38 that extends between diametric ends of the Dewar. Coil 13 is coaxial with sleeves 34-36 so that magnetic field $H_o$ also extends in the same direction as the common longitudinal axis of the sleeves.

In accordance with the present invention, solenoid 13 produces a very homogeneous magnetic field $H_o$ throughout sample 11. The magnetic field $H_o$ has virtually no spiral components, i.e., virtually all components of the field passing through sample 11 are aligned with the axis of solenoid 13 and sleeves 34-36. In addition, there are substantially no radial components of the magnetic field $H_o$ in the region where sample 11 is located.

To these ends, solenoid 13 is wound from superconducting wire having a rectangular cross-section. In the embodiment illustrated in FIG. 2, the superconducting wire has a monofilament configuration including a core 41 of ductile Niobium-Titanium alloy wire having a circular cross-section surrounded by a copper sheath 42 with a rectangular cross-section. Coated on the exterior faces of sheath 42 is an oxide, dielectric layer (not shown), which probably can be eliminated for certain situations. Typically, the base of rectangle 42 has a length of 0.016" and the rectangle has a height of 0.013" and core 41 has a diameter of 0.010". The small diameter of core 41 causes the magnetic field produced by the wire, when it is excited by supply 18, to have a constant position relative to the wire cross section so that the field does not wander significantly across the wire. It is to be understood that the superconducting wire can have other dimensions; in one actually tested configuration core 41 had a diameter of 0.016". The superconducting wire also has these relatively small dimensions to reduce the amount, and therefore cost, of superconductor required in core 41. A relatively low excitation current of between 30 and 50 amperes is applied by power supply 18 to the wire illustrated in FIG. 2 prior to the NMR spectrometer being put into operation.

The superconducting wire illustrated in FIG. 2 is wound as a plurality of helical layers, each concentric with the longitudinal axis of coil 13, as illustrated in FIGS. 3 and 4. As schematically illustrated by the exploded view of FIG. 3, immediately adjacent helical layers 43 and 44 are wound so that they have oppositely directed pitches, i.e., helical layer 43 is wound in a downward direction, while helical layer 44, immediately adjacent layer 43, is wound upwardly. Between adjacent helical layers is a thin dielectric sheet 45 of Mylar (FIG. 4) that electrically insulates adjacent layers from each other and reduces the coil inductance if the cores 41 of adjacent layers go normal, i.e., no longer remain superconducting. During superconducting operation, the impedance of copper sheath 42 relative to the impedance of superconducting core 41 is so great that the copper appears to be similar to an open circuit. If core 41 goes normal, copper sheath 42 provides a shunt path for the portion of the core that has gone normal, thereby tending to avoid the possibility of the entire coil going normal if only a small segment thereof goes normal.

Because of the rectangular cross-section of the superconducting wire, adjacent oppositely wound layers are true helices, having a constant pitch throughout their lengths. Adjacent faces 46 and 47 of helical layers 43 and 44 substantially abut against each other, being separated from each other solely by sheath 45. Each abutting layer has a cylindrical outer perimeter of virtually constant radius, in contrast to the varying radius of a helix formed of circular cross section wire; because of the constant radius cylinder winding of adjacent, truly helical layers is facilitated.

The superconducting wire is arranged so that adjacent, orthogonally extending faces 48 and 49 thereof are arranged so that the longer face 48 is at right angles to the longitudinal axis of the solenoid and the shorter face 49 extends parallel to the solenoid axis. By arranging faces 48 and 49 of the superconducting wire in this manner, the tendency for adjacent turns of helical layer 43, for example, to sag to the side of the previously wound turn of layer 43 is substantially obviated.

Reference is now made to FIG. 5 of the drawing wherein there is illustrated a second embodiment of a superconducting wire that can be utilized to form the successively wound helical layers of the present invention. The superconducting wire is formed as a copper block 51 having a rectangular cross-section, preferably with a base of 1 mil and a height of 0.36 mils. A multiplicity of bores having extremely small diameters extend longitudinally through block 51. Extending through each of the bores of block 51 is an individual superconducting strand 52 having a cross-sectional dimension of approximately 5 microns. In one preferred embodiment, 3,553 superconducting strands 52 extend through copper block 51. Excitation of the superconducting coil causes a superconducting coil to flow in each of these strands, to assure a constant magnetic flux across all segments of the superconducting wire.

Copper block 51 is wound in a series of concentric, oppositely directed helical layers, spaced from each other by a Mylar sheath, in the same manner as described in connection with FIGS. 3 and 4 for the monofilament superconducting wire. Hence, immediately adjacent helices formed of copper block 51 have oppositely directed pitches and faces that abut substantially against each other, being separated from each other solely by the Mylar sheath. Also, adjacent turns of the same helix formed by copper block 51 have faces that abut against each other. All of the strands 52 extending through a copper block 51 are bonded to each other and to wire 19 that is connected to power supply 18.

It is to be understood that many changes can be made in the specifically described embodiments without departing from the scope of the invention and that the invention is to be determined from the scope of the following claims, not limited to the specifically described embodiments.

What is claimed is:

1. An NMR spectrometer for testing a sample comprising a transmitting coil for applying an rf field to the sample, a receiver coil coupled to the sample for deriving a signal indicative of the NMR properties of the sample, a solenoid coil having a longitudinal axis about which the coil is wound and a central core in which said transmitting and receiver coils and said sample are positioned, said coil applying a homogeneous DC magnetic field to the sample, said coil being formed of superconducting wire having a rectangular cross-section, said wire being formed of a non-superconducting metal having a relatively low room temperature *electrical conductivity, said* material surrounding *said* superconductor material having a small enough cross-sectional area that a magnetic field resulting from current flowing in the superconductor material has a relatively constant location relative to the cross-section of the wire, said wire being wound as a plurality of helices each of which is concentric with the coil longitudinal aixs, immediately adjacent helices having oppositely directed pitches and faces that abut substantially against each other, adjacent turns of the same helix having faces that abut against each other.

2. The spectrometer of claim 1 wherein the superconductor material has a maximum cross section dimension of approximately 0.016 inches.

3. The spectrometer of claim 1 wherein adjacent faces of the wire differ in length so that the longer and shorter faces respectively extend transversely and parallel to the longitudinal axis of the coil.

4. The spectrometer of claim 3 wherein the wire has a monofilament configuration including a core of the superconducting material surrounded by a sheath of the non-superconducting metal.

5. The spectrometer of claim 4 wherein the longer and shorter faces respectively have dimensions of approximately 0.016" and 0.013".

6. The spectrometer of claim 5 wherein the core has a diameter of approximately 0.01 inches.

7. The spectrometer of claim 3 wherein the wire includes a block of the non-superconducting metal having [relatively high room temperature] *a higher electrical* conductivity *than the superconductor in the normal phase thereof*, a multiplicity of strands of the superconducting material extending through the block.

8. The spectrometer of claim 7 wherein the longer and shorter faces respectively have dimensions of approximately 1 mil and 0.36 mils, each of said strands having a cross-sectional thickness of approximately 5 microns.

9. The spectrometer of claim 1 further including a layer of dielectric material between adjacent faces of adjacent ones of said helices.

10. The spectrometer of claim 1 wherein the wire has a monofilament configuration including a core of the superconducting material surrounded by a sheath of the non-superconducting metal.

11. The spectrometer of claim 1 wherein the wire includes a block of the non-superconducting metal having a relatively high [room temperature] *electrical* conductivity *compared to the superconductor in the non-superconducting phase thereof*, a multiplicity of strands of the superconductor material extending through the block.

12. In combination with an NMR spectrometer for testing a sample, a solenoid coil having a longitudinal axis, said coil applying a homogeneous DC magnetic field to the sample, said coil being formed of superconducting wire having a rectangular cross-section, said wire being formed of a non-superconducting metal having a relatively low [room temperature] *electrical conductivity compared to said superconductor in the superconducting phase thereof, said* material surrounding *said* superconductor material having a small enough cross sectional area that a magnetic field resulting from the current flowing in the superconductor material has a relatively constant position relative to the cross section of the wire, and means for maintaining said coil at cryogenic, liquid helium temperatures.

13. The combination of claim 12 wherein adjacent faces of the wire differ in length so that the longer and shorter faces respectively extend transversely and parallel to the longitudinal axis of the coil.

14. The combination of claim 13 wherein the wire has a monofilament configuration including a core of the superconducting material surrounded by a sheath of the non-superconducting metal.

15. The combination of claim 13 wherein the wire includes a block of the non-superconducting metal, and a multiplicity of strands of the superconductor material extending through the block.

* * * * *